US005241223A

United States Patent [19]
Banker et al.

[11] Patent Number: 5,241,223
[45] Date of Patent: Aug. 31, 1993

[54] $NOR_i$ CIRCUIT/BIAS GENERATOR COMBINATION COMPATIBLE WITH CSEF CIRCUITS

[75] Inventors: Dennis C. Banker, Newburgh; Jack A. Dorler, Holmes, both of N.Y.; Paul D. Hendricks, Whitehall, Pa.; Frank M. Masci, Wappingers Falls; Stephen J. Tytran, Pleasant Valley, both of N.Y.

[73] Assignee: International Business Machines Corporation, Armonk, N.Y.

[21] Appl. No.: 881,592

[22] Filed: May 12, 1992

[51] Int. Cl.$^5$ .............................................. H03K 3/01
[52] U.S. Cl. .................................. 307/455; 307/443; 307/296.6
[58] Field of Search ..................... 307/455, 443, 296.6, 307/296.4, 553

[56] References Cited

U.S. PATENT DOCUMENTS

| | | | |
|---|---|---|---|
| 4,490,630 | 12/1984 | Freeman | 307/455 |
| 4,575,647 | 3/1986 | Ashton | 307/296.6 |
| 4,605,871 | 8/1986 | Price | 307/443 |
| 4,677,312 | 6/1987 | Freeman | 307/455 |
| 4,709,169 | 11/1987 | Ashton et al. | 307/455 |
| 4,871,977 | 10/1989 | Schilling et al. | 330/255 |
| 5,072,136 | 12/1991 | Naghshineh | 307/455 |

OTHER PUBLICATIONS

"Half-Current Switch Circuit", IBM Technical Disclosure Bulletin, vol. 23, No. 7A, pp. 2813-2814, Dec. 1980.
"Switchable Low Voltage Current Source", IBM Technical Disclosure Bulletin, vol. 30, No. 5, pp. 9-15, Oct. 1987.
"Improved VX Generator", IBM Technical Disclosure Bulletin, vol. 33, No. 6B, pp. 370-371, Nov. 1990.

Primary Examiner—Edward P. Westin
Assistant Examiner—Andrew Sanders

[57] ABSTRACT

NOR logic performed by a half current switch emitter follower ("HCSEF") circuit utilizing a transistor operated in the inverse active mode as its current source and having logic levels compatible with those of current switch emitter follower ("CSEF") circuitry is combined with a novel reference bias generator that controls the logic low voltage level by controlling the voltage drop across the current source. The $NOR_i$ circuit utilizes less power than CSEF circuits, has a natural threshold equal to the threshold of CSEF circuits to which it is coupled, has a delay skew of approximately 1:1, and maintains minimum signal levels with respect to variations on $V_{cc}$. The reference bias generator compensates for temperature, process variables and variations in the $NOR_i$ circuit and in the power supply.

18 Claims, 3 Drawing Sheets $NOR_i$ REFERENCE BIAS GENERATOR / $NOR_i$ CIRCUIT

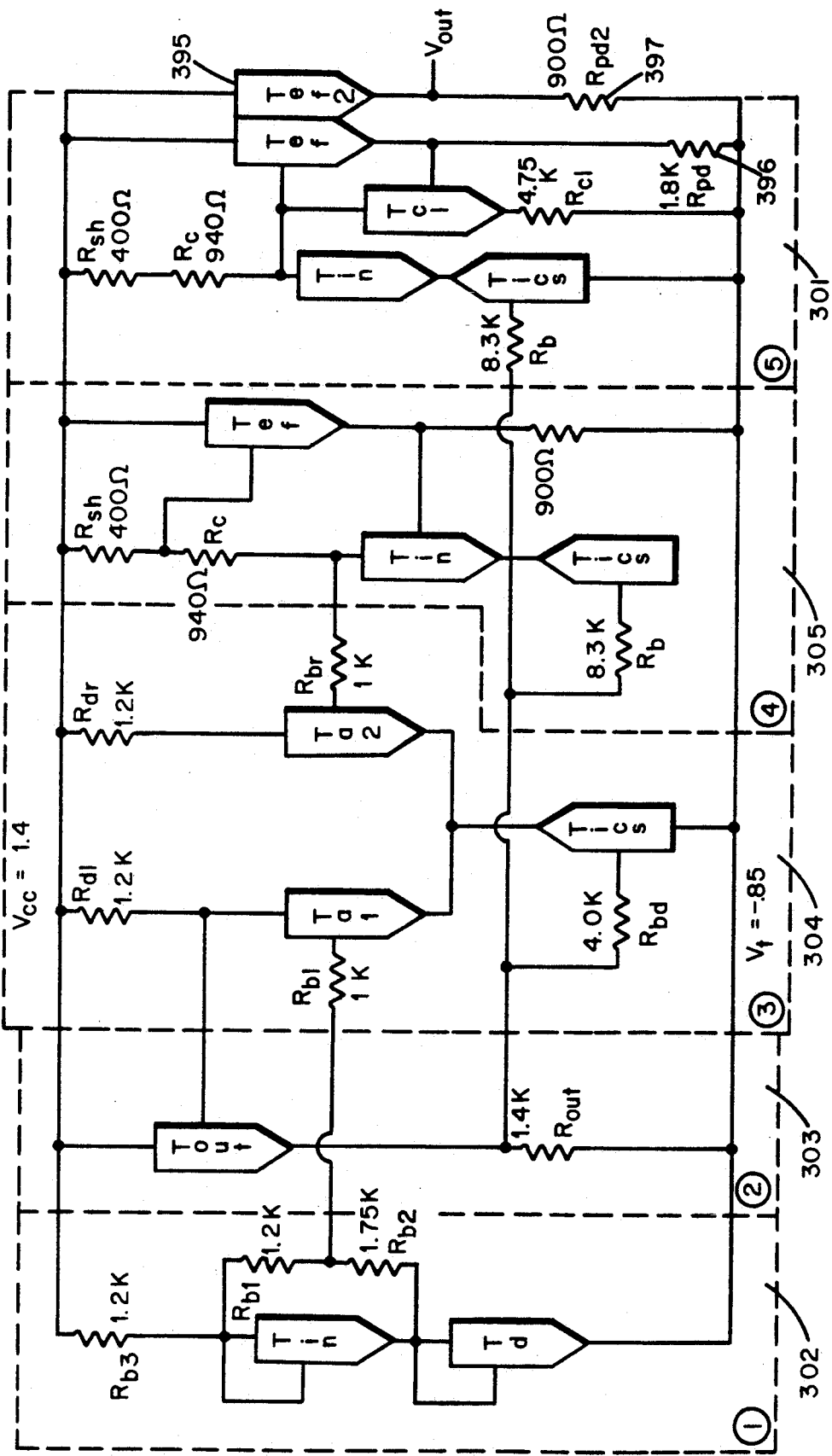

NOR$_i$ CIRCUIT/BIAS GENERATOR COMBINATION COMPATIBLE WITH CSEF CIRCUITS

RELATED APPLICATIONS

U.S. patent application Ser. No. 881595, assigned to the assignee hereof and filed on the same day herewith, contains a disclosure of transistors useful in the practice of the invention and is incorporated by reference.

BACKGROUND OF THE INVENTION

1. Field of the Invention

The invention relates generally to circuitry that may be used to perform a NOR logic function. More particularly, the invention relates to half current switch emitter follower ("HCSEF") circuitry that performs a NOR function and has bias levels compatible with current switch emitter follower ("CSEF") circuitry and that utilizes less power than CSEF circuits. The novel circuit is referred to as a "NOR$_i$" circuit since it utilizes a transistor operated in the inverse active mode as its current source.

The invention also relates to a companion reference bias generator for the NOR$_i$ circuit. The reference bias generator compensates for process, power supply, and temperature changes in order to maintain a constant down level (or lower logic level) in the NOR$_i$ circuit.

2. Description of the Related Art

Half current switch circuits that perform a logical NOR function are well known. For example, one such circuit is described in an article entitled "Half-Current Switch Circuit" by Bass, et al, published in December, 1980, in IBM Technical Disclosure Bulletin, Volume 23, No. 7A ("IBM" is a trademark owned by the International Business Machines Corporation).

The advantage of using HCSEF circuits on integrated circuit also containing CSEF circuitry is the potential for overall circuit performance improvement (in particular, power and density savings) when only the NOR logic function is required. However, a compatibility problem exists when using HCSEF circuits on integrated circuit containing CSEF circuits. A mismatch in the natural threshold of HCSEF and CSEF circuits, poor delay skew, and insufficient temperature and process compensation, all limit the functionality of HCSEF circuits (such as the exemplary HCSEF circuitry described in the referenced publication), when combined with CSEF circuits.

A further problem is that if the HCSEF are run with a lower rail voltage of −0.7 V, available for CSEF circuits, insufficient noise tolerance would result for the NOR$_i$ circuit.

Accordingly, it would be desirable to provide HCSEF circuitry that is compatible with CSEF circuits on a common integrated circuit. More particularly, it would be desirable to provide HCSEF circuitry that has a natural threshold equal to the threshold of any CSEF circuit to which it is coupled; HCSEF circuitry that has a delay skew of approximately 1:1 as compared with most HCSEF circuits which have delay skews in excess of 4:1; and HCSEF circuits which operate in combination with a bias generator to compensate for temperature and process variables.

SUMMARY OF THE INVENTION

The invention relates to NOR logic circuits having logic levels compatible with CSEF logic and employing a current sink transistor operating in the inverse active mode and having its Vec controlled by a reference bias circuit that both maintains the NOR threshold and also compensates for process, temperature, and power supply variations.

A feature of the invention is the provision of NOR$_i$ HCSEF circuits that have a natural threshold equal to the threshold of CSEF circuits.

Another feature of the invention is the provision of a NOR$_i$ circuit that has a delay skew of approximately 1:1.

According to another aspect of the invention the NOR$_i$ circuit itself comprises: (a) an inverse active switchable current source; (b) a clamping network controlling an output transistor for establishing a CSEF compatible up level; and (c) an inverter having an emitter follower output stage with a translated $V_t$ power supply to establish a natural threshold voltage equal to the CSEF threshold voltage.

Yet another feature of the invention is a reference bias generator that compensates for temperature, process variables and also variations in the $V_t$ power supply in the NOR$_i$ logic and includes:

(a) a differential amplifier stage, coupled to an emitter follower output stage, and having a transistor operated in the inverse active mode as its current source;

(b) a reference generator having a transistor matched to an input transistor of the NOR$_i$ circuit that enables the reference bias generator to compensate for changes in the natural threshold of said NOR$_i$ circuit, the reference generator providing an input to the differential amplifier having a nominal value one $V_{be}$ above the logic low level;

(c) a feedback tracking stage, coupled to said differential amplifier stage and containing a transistor matched to the input transistor of the NOR$_i$ circuit and a load transistor operating in the inverse active mode for providing compensation for process, power supply and temperature changes in order to maintain a constant down level in the NOR$_i$ circuit coupled to the reference bias generator, the feedback tracking stage also providing an input to the differential amplifier having a nominal value one $V_{be}$ above the logic low level; and (d) an emitter follower output stage, coupled to said reference generator, for driving the inverse active switchable current source included in the NOR$_i$ circuit coupled to the reference bias generator to control the inverse active switchable current source to maintain the design voltage of the logic low level.

The invention features the ability to perform a NOR function in a manner that is compatible with CSEF circuits at considerable power savings, circuitry that offers density advantages over CSEF circuitry, and circuitry that, in addition to compensating for temperature, process variables and variations in the $V_t$ power supply in the NOR$_i$ logic, maintains minimum signal levels with respect to variations on $V_{cc}$.

These and other objects and features of the present invention and the manner of obtaining them will become apparent to those skilled in the art, and the invention itself will be best understood by reference to the following detailed description read in conjunction with the accompanying Drawing.

DESCRIPTION OF THE DRAWINGS

FIG. 3 depicts an alternative illustrative embodiment of a NOR$_i$ reference bias generator combined with a NOR$_i$ circuit, in accordance with the teachings of the invention, where the embodiment depicted supports "wired-or" logic functions.

DETAILED DESCRIPTION

Figure 1:
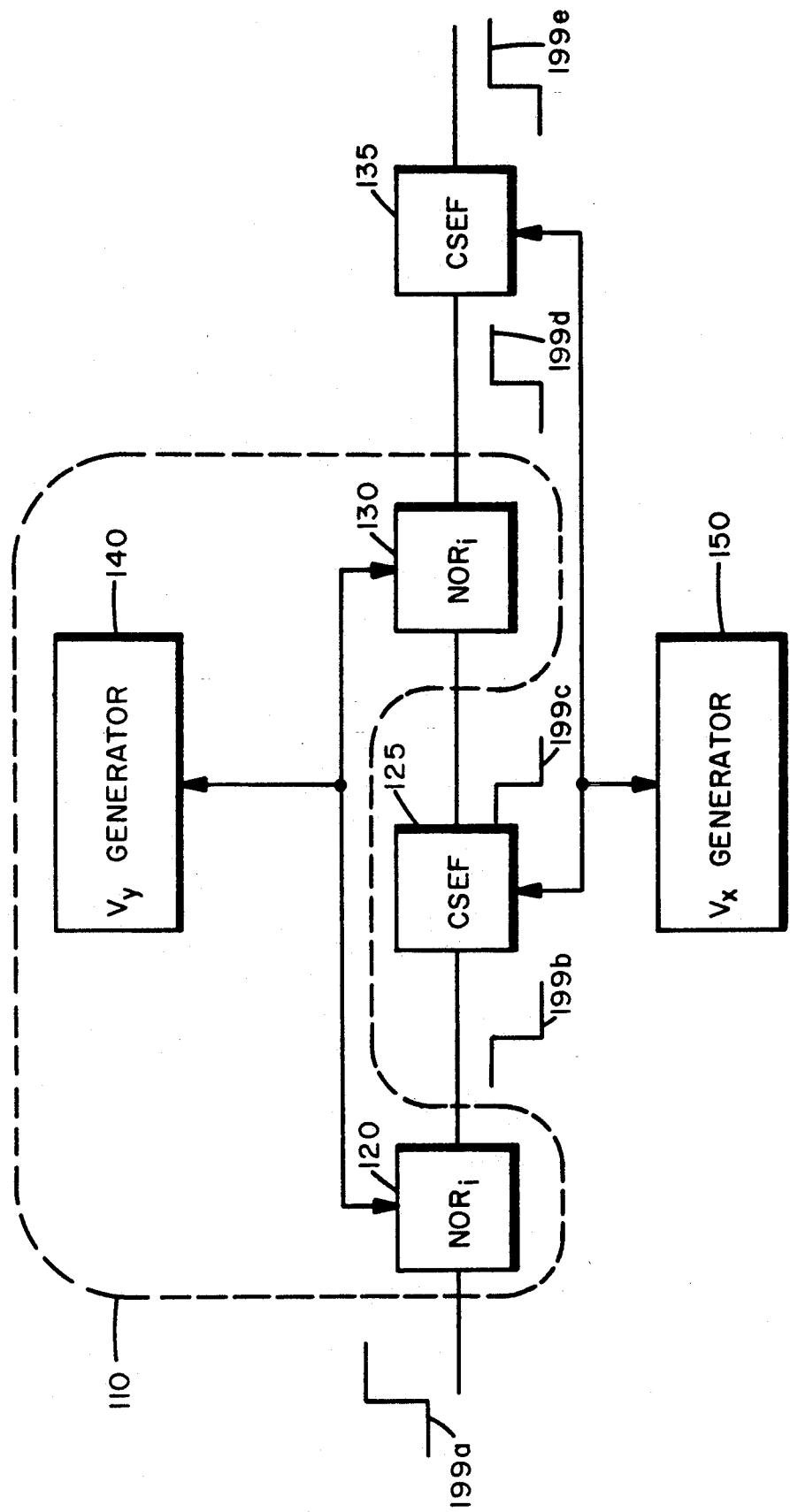
FIG. 1 illustrates an example of CSEF and NOR$_i$ circuitry coupled on a common integrated circuit together with their corresponding bias generators.

FIG. 1 illustrates an example of CSEF and NOR$_i$ circuits coupled on a common integrated circuit together with their corresponding bias generators. Shown within dashed line 110 of FIG. 1 is a high level view of the NOR$_i$ logic that is the subject matter of the present invention, showing NOR$_i$ circuits 120 and 130, both coupled to V$_y$ generator 140 (the aforementioned reference bias generator).

NOR$_i$ circuit 120 is coupled to CSEF circuit 125, and NOR$_i$ circuit 130 is coupled between CSEF circuits 125 and 135. The CSEF circuits are shown coupled to V$_x$ generator 150 (the reference bias generator for the CSEF circuitry). The CSEF circuits and the V$_x$ generator depicted in FIG. 1 do not constitute a part of the invention per se and are well known devices. In particular, a suitable V$_x$ generator for a CSEF circuit is described in an article entitled "Improved V$_x$ Generator" by Banker, et al, published in November, 1990, in IBM Technical Disclosure Bulletin, Volume 33, No. 6B.

FIG. 1 goes on to illustrate what happens to a signal (199a) that is input to NOR$_i$ circuit 120, as it passes through the combinatorial logic shown in FIG. 1. For purposes of simplifying the illustration, the NOR$_i$ circuits are shown as single-input inverters (as depicted at 199b and 199d); whereas the CSEF circuits (as depicted at 199c and 199e), while capable, do not perform an inverter function in the circuit depicted in FIG. 1.

Given the aforementioned desirability of implementing two circuit types on a integrated circuit, i.e., CSEF and NOR$_i$ type circuits, then these circuits must be able to communicate with each other. This compatibility issue can be characterized in terms of three distinct problems. One problem is the different DC thresholds of the circuits in question. Another problem is the delay skew (T$_{on}$ versus T$_{off}$) of the NOR$_i$ type circuits. Additionally, temperature and process compensation are important for proper circuit communication and operation.

In a conventional CSEF system where V$_{cc}$ is 1.4 V, V$_t$ (an intermediate voltage) is $-0.7$ V, V$_{EE}$ (the lower rail voltage) is $-2.2$ V, and V$_r$ (a reference level standard in CSEF circuits that determines the threshold of CSEF circuits on a integrated circuit) is 0 volts, the CSEF has a swing of approximately $\pm 0.3$ volts which the HCSEF must match. Typically, with power supply levels of V$_{cc}$ $-1.4$ V and an HCSEF lower rail voltage of V$_t$ $= -0.7$ V, the HCSEF signal swing would be approximately 0.55 volts to $-0.05$ volts, obviously not compatible with CSEF.

Figure 2:
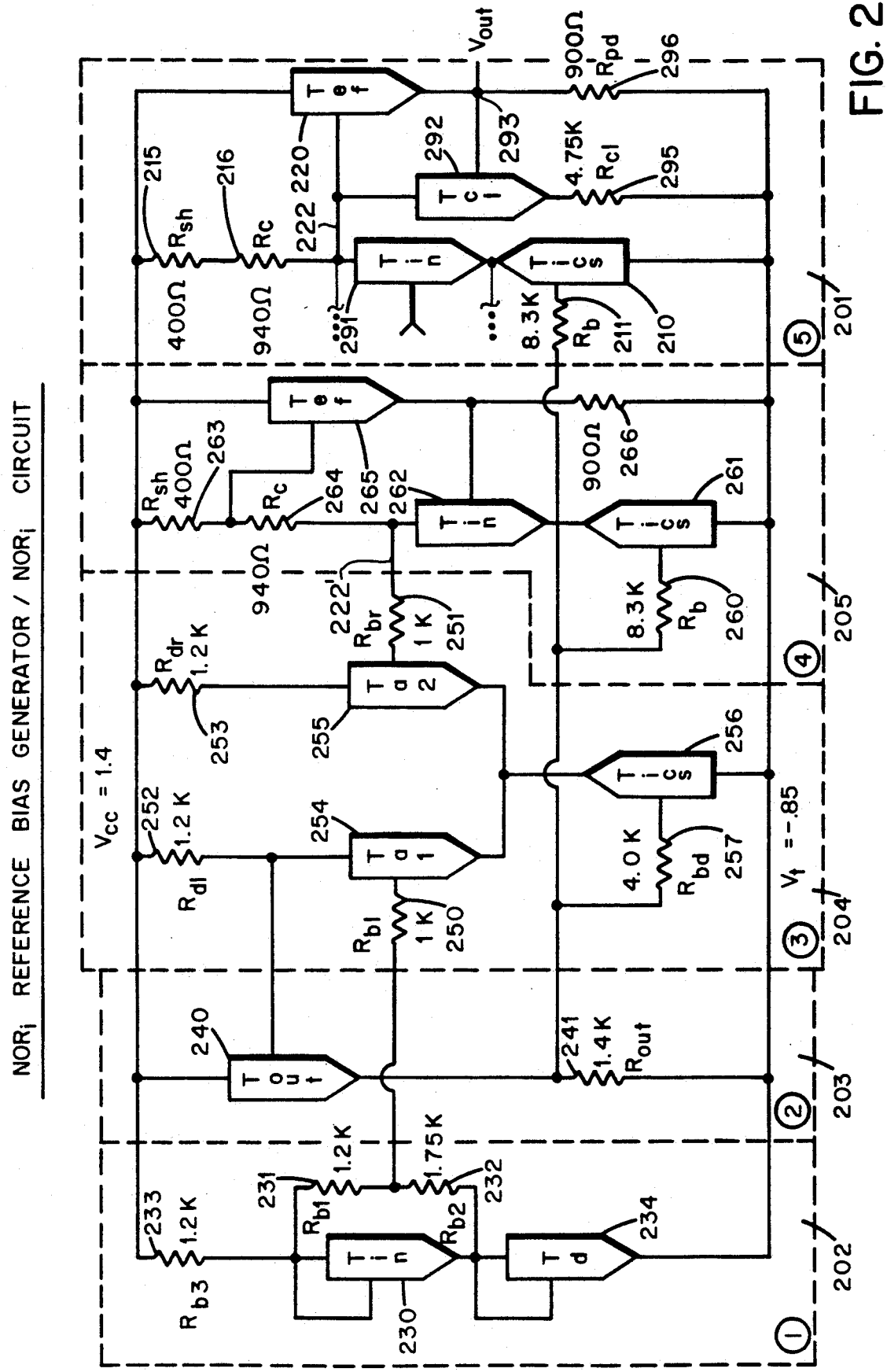
FIG. 2 depicts an illustrative embodiment of a NOR$_i$ reference bias generator combined with a NOR$_i$ circuit in accordance with the teachings of the invention.

The circuits depicted in FIGS. 2 and 3, with a change in the lower rail voltage or the voltage on a lower rail terminal V$_t$ from $-0.7$ V, an intermediate level used on IBM CSEF emitter follower circuits, to $-0.85$ V show a feedback up level clamp that will enable the HCSEF type circuit to have a signal swing to match CSEF, and an acceptable delay skew better than 1.5 to 1. Furthermore, the feedback clamp depicted in FIGS. 2 and 3, to be described in greater detail after, reduces circuit sensitivity to changes in V$_{cc}$ and temperature. FIGS. 2 and 3 show two different implementations of the feedback clamp with the basic operation of the clamp being the same for both circuits.

Referring now to section 201 of FIG. 2, when the output is logic high (also referred to as the up level), T$_{in}$ 291 is off and T$_{cl}$ 292 is on in order to establish a current passing through R$_{sh}$ 215 and R$_c$ 216 that provides the desired up level voltage of $+0.3$ V on node 293 that is one V$_{be}$ below the voltage on node 222. When the output is in the down level, then T$_{in}$ 291 is on and T$_{cl}$ 292 is off, so that the down level voltage is also set by the IR drop across resistors 215 and 216, the current being drawn by load transistor 295. The bias generator provides for a constant difference between the natural threshold (0 V) and the down level, thereby maintaining the desired noise tolerance. The mechanism that effects this result is control of the base current into transistor 210 to maintain its V$_{ec}$ at its design value. Section 5 202 in FIG. 2 feeds a voltage that is one V$_{be}$ above the desired down level into the differential amplifier stage 204 and section 205 feeds in a correction signal having a nominal value of one V$_{be}$ above the down level plus an offset that results from temperature charge, process variations, etc. to compensate for temperature and other effects. The resulting current flowing into the base of transistor 210 keeps the transistor at its design point on its I-V curve and therefore maintains the current through resistors 215 and 216 at an appropriate amount to keep the voltage on node 222 at its correct value of logic low plus V$_{be}$.

When V$_{cc}$ goes up, the output level tends to go up; but this results in T$_{cl}$ 292 turning on harder pulling down the base of the emitter follower and thus bringing the output level down again. Similar scenarios apply when there is a shift in temperature. The particular parameters used in the embodiment result in a $+50$ millivolt increase in V$_{out}$ for a $+100$ millivolt change in V$_{cc}$.

The functional difference between the circuits depicted in FIGS. 2 and 3 are that the circuits shown in FIG. 3 has two output emitter follower transistors with their bases tied together and supports emitter dotting (with the addition of transistor T$_{ef}$ 395; replacing resistor R$_{pd}$ 296 of FIG. 2 with resistor R$_{pd}$ 396, shown in the illustrative circuit depicted in FIG. 3 to be a 1.8 K resistor; and adding resistor 397, shown as a 900 ohm resistor in the illustrative circuit depicted in FIG. 3); while the circuit depicted in FIG. 2 does not.

Those skilled in the art will readily appreciate with reference to FIGS. 2 and 3 that the delay skew problem referred to above is, according to the invention, solved via a clamping structure that establishes a small tolerance band on the value of a NOR$_i$ up level compatible with that of a CSEF circuit, so that the transition time to the up level is more consistent. In prior art circuits, the rise time was greatly affected by an RC time constant characteristic of a load resistor.

The DC threshold mismatch between CSEF and NOR$_i$ logic is, according to the invention, solved by the introduction of an inverse active switchable low voltage current source that replaces the forward active current source commonly used in CSEF circuits, in addition to a 150 mV translation of the $V_t$ power supply.

Switchable current sources used in combination with logic circuits that perform logical NOR functions are well known and do not constitute a part of the invention per se. For example, one such switchable current source is described in an article entitled "Switchable Low Voltage Current Source" by Banker et al, published in October, 1987, in IBM Technical Disclosure Bulletin, Volume 30, No. 5. This circuit uses a resistive load that may suffer from process variations and also presents difficulties in operation at low voltages. The problem of compensation for temperature and process variations is solved by the introduction of the novel reference bias generator described below.

The following description refers to the segmented circuit diagram of FIGS. 2 and 3. Sections 202, 203, 204 and 205 of FIG. 2 are identical to depicted sections 302, 303, 304 and 305 of FIG. 3 and correspond to what will be referred to after as the "reference stage", "output stage", "differential amplifier" and "feedback/tracking stages" of the novel reference generator, respectively. Accordingly, only sections 202-205 will be described with the description of these stages being equally applicable to stages 302-305.

It should also be noted that stages 202-205 of FIG. 2 (and stages 302-305 of FIG. 3), correspond to $V_y$ generator 140 in FIG. 1. Finally, it should be noted that the specific values for resistors, $V_{cc}$, etc., set forth in FIGS. 2 and 3, are set forth only for the sake of illustrating the principles of a working embodiment of the invention. The illustrative embodiments of the invention presented are not in any way intended to limit the scope or spirit of the invention.

Sections 201 of FIG. 2 and 301 of FIG. 3, differ as described above (using illustrative pull down resistor values, etc.) insofar as the $NOR_i$ stage 201 depicted in FIG. 2 does not support emitter dotting; while $NOR_i$ stage 301 of FIG. 3 does support emitter dotting.

With reference to section 201 of FIG. 2 it can be seen that the $NOR_i$ circuit itself comprises: (a) an inverse active switchable current source; (b) a clamping network for establishing a CSEF compatible up level; and (c) an inverter having an emitter follower output stage with a translated $V_t$ power supply to establish a natural threshold voltage equal to the CSEF threshold voltage. For simplicity, only one transistor Tin is shown. A multi input NOR circuit is produced by adding a number of input transistors 291′, 291″, etc. in parallel with transistor 291, as indicated schematically by the dotted lines.

FIG. 2 shows the inverse active switchable current source to include the combination of a current source transistor, $T_{ics}$ 210, and base biasing resistor 211. In the illustrative circuit depicted in FIG. 2, 211 was chosen as an 8.3 K ohm resistor.

The clamping network depicted in FIG. 2 includes the combination of a clamp transistor ($T_{cl}$) 292, and an emitter resistor ($R_{cl}$), 295, which provide a current draw sufficient to establish the CSEF compatible up level whenever said switchable current source is switched off by drawing a current through resistors 215 and 216 that establishes a voltage on node 222 that is a $V_{be}$ above the desired voltage for output node 293. When node 293 is at the lower voltage level, transistor 292 is off and control of the voltage on node 293 is provided by the current sunk through transistor 210.

The inverter is also depicted in FIG. 2 and is shown to include (a) an input transistor ($T_{in}$) 291; (b) a first bias resistor ($R_{sh}$) 215; (c) a second bias resistor ($R_c$) 216, connected in series with the first bias resistor 215, which together establish both the up and down level for the $NOR_i$ circuit; and (d) an emitter follower transistor ($T_{ef}$) 220, combined with a pull down resistor ($R_{pd}$) 296, for impressing the $NOR_i$ circuit output level ON the following logic stage.

As indicated above, stage (section) 301 of FIG. 3 depicts an alternate embodiment of the invention in which the aforementioned inverter includes a second emitter follower transistor ($T_{ef2}$) 395, combined with a second pull down resistor ($R_{pd2}$) 397, for isolating said clamping network from said output level to enable emitter dotting to be performed.

Referring now to FIG. 2 (and the identical components shown in the illustrative circuit depicted in FIG. 3), stages 202-205 constitute a reference bias generator for the $NOR_i$ circuits depicted in FIGS. 2 and 3, that includes (a) a reference stage 202, that enables the reference bias generator to compensate for changes in the natural threshold of $NOR_i$ circuit 201; (b) an emitter follower output stage 203, coupled to reference stage 202, for driving the inverse active switchable current source associated with $NOR_i$ circuit 201; (c) a differential amplifier stage 204, coupled to emitter follower output stage 203, having a transistor operated in the inverse active mode as its current source in order to improve the gain of the amplifier; and (d) a feedback tracking stage 205, coupled to differential amplifier stage 204, to provide compensation for process, power supply and temperature changes in order to maintain a constant down level in $NOR_i$ circuit 201. The output from stage 203 differs from its nominal value by the sum of two correction terms. One is provided by section 202 to maintain the inverter threshold and the other is provided by section 205 to compensate for process, voltage, and temperature variations.

Functionally, reference stage 202 allows the $V_y$ generator to compensate for changes in the natural threshold of the $NOR_i$ circuit. According to the illustrative embodiment of the invention depicted in FIG. 2, reference stage 202 includes: (a) a first transistor 230 that is identical to said input transistor (291) of $NOR_i$ circuit 201; (b) means for translating ($R_{b1}$, $R_{b2}$), shown as resistors 231 and 232 respectively, the $V_{be}$ of transistor 230 into the input of differential amplifier stage 204; and (c) means for establishing ($R_{b3}$, $T_d$), shown as resistor 233 and transistor 234 respectively, the input level of differential amplifier stage 204. In the illustrative embodiment depicted in FIG. 2, resistors 231-233 were chosen to have the values 1.2 K, 1.75 K and 1.2 K, respectively.

The emitter follower output stage shown in FIG. 2, stage 203, is shown as a typical emitter follower used to drive a portion of the $NOR_i$ circuit current sources on a chip, including an emitter follower transistor 240 combined with a pull down resistor 241, having an illustrative resistance of 1.4 K ohms. The particular set of values illustrated will permit the circuit to drive on the order of 100 $NOR_i$ circuits, comparable to the drive capacity of the counterpart $V_x$ circuit in FIG. 1.

FIG. 2 goes on to depict a novel differential amplifier stage as compared to those found in standard CSEF reference generators. The differential amplifier stage, stage 204 as depicted in FIG. 2, uses an inverse active current source load. The small $V_{ce}$ required across this inverse device allows the difference between the power supply rails to be lowered (Vcc−Vt changes from 3.6 V to 2.25 V) while maintaining a high gain in the amplifier. This resulted in a significant power reduction, with no penalty in circuit performance or stability.

More particularly, the illustrative differential amplifier stage 204 as depicted in FIG. 2, includes (a) a differential amplifier, shown comprised of components resistors 250-253 (also shown as resistors $R_{bl}$, $R_{br}$, $R_{dl}$ and $R_{dr}$, respectively), and transistors 254-255 (also shown as transistors ($T_{a1}$ the reference input transistor and $T_{a2}$ the tracking input transistor, respectively); and (b) an amplifier load transistor 256 (also shown as transistor $T_{ics}$) operated in the inverse active mode, combined with a load base resistor 257 (also shown as resistor $R_{bd}$), to set the current level in the differential amplifier.

According to the depicted illustrative embodiment of the invention, the values chosen for resistors 250-253 and resistor 257 are, respectively, 1 K, 1 K, 1.2 K, 1.2 K and 4 K ohms.

Finally, FIG. 2 depicts the feedback/tracking stage, 205, of the novel bias generator. The purpose of this portion of any bias generator is to provide compensation for process, power supply, and temperature changes in order to maintain a constant down level in the load circuit. Both stages 202 and 205 provide an input to the amplifier 204 that has a nominal voltage value of the nominal value of node 222. Deviations in these circuits from their design values result in a change from the nominal input and provide a correction signal that controls node 222 in the logic low state.

Thus, this stage (stage 205) must differ greatly from that found in a standard CSEF bias generator. One difference is the inclusion of both a base resistor and inverse active mode transistor identical to those found in the load circuit. This provides the necessary compensation in the $V_Y$ voltage in order to maintain a constant down level in the load circuit independent of process and/or temperature variations in the circuit components, or variations in the $V_t$ power supply, since the collector of transistor 262 tracks that of input transistor 291 and feeds the result into one input of the amplifier. The remaining components in this section provide the proper $V_{ec}$ bias of 0.350 V across transistor 261 in order to compensate for the increased "Early Effect" present in transistors operated in the inverse active mode.

More particularly, according to the illustrative embodiment of the invention being set forth with reference to FIG. 2, feedback/tracking stage 205 includes:

(a) an inverse active current source ($R_b$, $T_{ics}$), having a current source transistor and base resistor (also shown in FIG. 2 as transistor 261 and resistor 260, respectively), which are identical to the current source transistor and base resistor in the aforementioned inverse active switchable current source portion of NOR$_i$ circuit 201;

(b) a second input transistor 262 (also shown in FIG. 2 as transistor $T_{in}$) and third and fourth biasing resistors 263 and 264 (also shown in FIG. 2 as resistors $R_{sh}$ and $R_c$) respectively, identical to the input transistor and first and second biasing resistors in the inverter portion of NOR$_i$ circuit 201; and (c) an emitter follower transistor, 265 and pull down resistor 266 (identical to transistor 220 and resistor 296 respectively) that, in conjunction with third biasing resistor 263 ($R_{sh}$), establish the same $V_{eec}$ across the inverse active current source transistor 261 as exists across inverse active current source transistor 210 of NOR$_i$ circuit 201. According to the depicted illustrative embodiment of the invention, the values chosen for resistors 260, 263, 264 and 266 are, respectively, 8.3 K, 400, 940 and 900 ohms.

In operation, stage 205 operates together with stage 204 in a feedback loop, in which the voltage on the collector of transistor 262 (node 222') is the discriminant that feeds into amplifier 204 to control the voltage on the base of transistor 261 to maintain the desired $V_{ec}$ and thus to control the discriminant voltage on node 222'.

What has been described in detail above are methods and apparatus meeting all of the aforestated objectives. As previously indicated, those skilled in the art will recognize that the foregoing description has been presented for the sake of illustration and description only. It is not intended to be exhaustive or to limit the invention to the precise from disclosed, and many modifications and variations are possible in light of the above teaching.

The embodiments and examples set forth were presented in order to best explain the principles of the instant invention and its practical application to thereby enable others skilled in the art to best utilize the instant invention in various embodiments and with various modifications as are suited to the particular use contemplated.

It is, therefore, to be understood that the claims appended hereto are intended to cover all such modifications and variations that fall within the true scope and spirit of the invention.

What is claimed is:

1. A NOR$_i$ circuit having high and low logic levels compatible with CSEF logic levels, comprising:
    an inverse active switchable current source having a collector connected to a lower voltage terminal, an emitter connected to a lower intermediate node, and an inverse base;
    an inverter connected between said lower intermediate node and an upper voltage terminal and having an emitter follower output stage with an output terminal;
    a clamping network connected to an emitter follower base of said emitter follower output stage for establishing a CSEF compatible logic high level; and
    a reference bias generator coupled to said inverse base for controlling a CSEF compatible logic low level on said output terminal.

2. A circuit according to claim 1, in which said clamping network further comprises the combination of a clamp transistor and an emitter resistor connected in series between said emitter follower base and said lower voltage terminal, said clamp transistor having a clamp base connected to said output terminal, whereby said clamp transistor provides a current draw sufficient to establish said CSEF compatible up level whenever said switchable current source is switched off.

3. A circuit according to claim 1, in which said inverter further comprises:
    at least one input transistor having an input base terminal, an input collector connected to an upper intermediate node, and an input emitter connected to said lower intermediate node;
    at least one set of first and second bias resistors connected in series between said upper voltage terminal and said upper intermediate node, for establishing both the up and down levels for the NOR$_i$ circuit; and
    an emitter follower output transistor having an output collector connected to said output node and to a pull down resistor for driving the NOR$_i$ circuit output level to a following logic stage.

4. A circuit according to claim 2, in which said inverter further comprises:
at least one input transistor having an input base terminal, an input collector connected to an upper intermediate node, and an input emitter connected to said lower intermediate node;
at least one set of first and second bias resistors connected in series between said upper voltage terminal and said upper intermediate node, for establishing both the up and down levels for the NOR$_i$ circuit; and
an emitter follower output transistor having an output collector connected to said output node and to a pull down resistor for driving the NOR$_i$ circuit output level to a following logic stage.

5. A circuit according to any one of claims 1-4, in which said reference bias generator further comprises:
a differential amplifier stage, having a reference input and a tracking input and having a transistor operated in the inverse active mode as its current source;
an emitter follower output stage, coupled to said differential amplifier stage, for driving said inverse active switchable current source;
a reference stage, connected to said reference input, for supplying a reference bias signal having the design voltage of said logic low level plus a predetermined offset voltage of V$_{be}$; and
a feedback tracking stage, connected to said tracking input, to provide compensation for parameter changes in order to maintain a constant down level in said NOR$_i$ circuit.

6. A circuit according to claim 5, in which said differential amplifier stage further comprises:
a differential amplifier including a reference input transistor with a reference base connected to said reference input and a tracking input transistor with a tracking base connected to said tracking input, said reference and tracking transistors being connected in parallel between said upper voltage level and an intermediate amplifier node; and
an amplifier load transistor operated in the inverse active mode, connected between said intermediate amplifier node and said lower voltage terminal and having an amplifier load base connected to said emitter follower output stage through a load base resistor, whereby the current level in the differential amplifier is controlled by said emitter follower output.

7. A circuit according to claim 5, in which said reference stage further comprises:
a first reference transistor that is identical to said input transistor, connected through level bias means between said upper and lower voltage terminals and having a reference collector voltage and a reference emitter voltage; and
means for coupling a reference voltage intermediate between said reference collector voltage and said reference emitter voltage into the reference input of said differential amplifier stage.

8. A circuit according to claim 5, in which said feedback tracking stage further comprises:
a feedback inverse active current source having a feedback current source transistor and base resistor that are identical to a corresponding NOR$_i$ current source transistor and NOR$_i$ base resistor in the inverse active switchable current source portion of said NOR$_i$ circuit and are also connected to said emitter follower output stage;
a feedback input transistor having a feedback input collector connected to said tracking input and third and fourth biasing resistors respectively identical to the input transistor and first and second biasing resistors in the inverter portion of said NOR$_i$ circuit;
a feedback emitter follower transistor and feedback pull down resistor identical to a corresponding NOR$_i$ emitter follower transistor and NOR$_i$ pull-down resistor; and
said feedback input transistor has a feedback input base connected to a feedback emitter of said feedback emitter follower transistor and said feedback emitter follower has a feedback emitter follower base connected to a bias node connecting said third and fourth biasing resistors and having a voltage equal to said logic high voltage, so that a feedback path is established through said differential amplifier stage to drive said feedback current source transistor to control said collector of said feedback input transistor, whereby said feedback tracking stage generates a correction signal on said tracking input that drives said reference bias generator to maintain said logic low level at a design value.

9. A circuit according to claim 6, in which said reference stage further comprises:
a first reference transistor that is identical to said input transistor, connected through level bias means between said upper and lower voltage terminals and having a reference collector voltage and a reference emitter voltage; and
means for coupling a reference voltage intermediate between said reference collector voltage and said reference emitter voltage into the reference input of said differential amplifier stage.

10. A circuit according to claim 6, in which said feedback tracking stage further comprises:
a feedback inverse active current source having a feedback current source transistor and base resistor that are identical to a corresponding NOR$_i$ current source transistor and NOR$_i$ base resistor in the inverse active switchable current source portion of said NOR$_i$ circuit and are also connected to said emitter follower output stage;
a feedback input transistor having a feedback input collector connected to said tracking input and third and fourth biasing resistors respectively identical to the input transistor and first and second biasing resistors in the inverter portion of said NOR$_i$ circuit;
a feedback emitter follower transistor and feedback pull down resistor identical to a corresponding NOR$_i$ emitter follower transistor and NOR$_i$ pull-down resistor; and
said feedback input transistor has a feedback input base connected to a feedback emitter of said feedback emitter follower transistor and said feedback emitter follower has a feedback emitter follower base connected to a bias node connecting said third and fourth biasing resistors and having a voltage equal to said logic high voltage, so that a feedback path is established through said differential amplifier stage to drive said feedback current source transistor to control said collector of said feedback input transistor, whereby said feedback tracking stage generates a correction signal on said tracking input that drives said reference bias generator to maintain said logic low level at a design value.

11. A circuit according to claim 1, in which said upper voltage terminal has a voltage equal to that applied to CSEF circuits and said lower voltage terminal has a negative voltage larger in magnitude than that applied to CSEF circuits by a predetermined lower voltage offset amount.

12. A circuit according to claim 11, in which the voltage on said lower voltage terminal is substantially −0.85 V.

13. A circuit according to claim 5, in which said upper voltage terminal has a voltage equal to that applied to CSEF circuits and said lower voltage terminal has a negative voltage larger in magnitude than that applied to CSEF circuits by a predetermined lower voltage offset amount.

14. A circuit according to claim 13, in which the voltage on said lower voltage terminal is substantially −0.85 V.

15. A circuit according to claim 6, in which said upper voltage terminal has a voltage equal to that applied to CSEF circuits and said lower voltage terminal has a negative voltage larger in magnitude than that applied to CSEF circuits by a predetermined lower voltage offset amount.

16. A circuit according to claim 5, in which said inverter further comprises a second emitter follower transistor having a second emitter follower base connected to said first emitter follower base and a second emitter connected to a second pull down resistor for isolating said clamping network from said output level to enable emitter dotting to be performed.

17. A circuit according to claim 6, in which said inverter further comprises a second emitter follower transistor having a second emitter follower base connected to said first emitter follower base and a second emitter connected to a second pull down resistor for isolating said clamping network from said output level to enable emitter dotting to be performed.

18. A circuit according to claim 8, in which said inverter further comprises a second emitter follower transistor having a second emitter follower base connected to said first emitter follower base and a second emitter connected to a second pull down resistor for isolating said clamping network from said output level to enable emitter dotting to be performed.

* * * * *